(12) United States Patent
Fujita

(10) Patent No.: US 6,215,987 B1
(45) Date of Patent: Apr. 10, 2001

(54) MOBILE COMMUNICATION TRANSMITTER CAPABLE OF SELECTIVELY ACTIVATING AMPLIFIERS

(75) Inventor: Masanori Fujita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/090,883

(22) Filed: Jun. 5, 1998

(30) Foreign Application Priority Data

Jun. 6, 1997 (JP) .................................................... 9-149229

(51) Int. Cl.$^7$ .............................. H01Q 11/12; H04B 7/00; H03F 1/14
(52) U.S. Cl. ........................ 455/127; 455/522; 455/126; 330/51
(58) Field of Search ............................ 455/91, 115, 116, 455/121, 126, 127, 129, 550, 575, 69, 522, 241.1, 251.1, 253.2; 330/51, 126, 151, 129, 302, 295

(56) References Cited

U.S. PATENT DOCUMENTS

| 4,485,486 | * | 11/1984 | Webb et al. | 455/450 |
| 4,598,252 | * | 7/1986 | Andricos | 330/51 |
| 4,755,769 | * | 7/1988 | Katzs | 330/295 |
| 5,251,328 | * | 10/1993 | Shaw | 455/73 |
| 5,256,987 | * | 10/1993 | Kibayashi et al. | 330/295 |
| 5,303,268 | * | 4/1994 | Tsutsumi et al. | 375/296 |
| 5,335,369 | * | 8/1994 | Aisaka | 455/116 |
| 5,446,920 | * | 8/1995 | Matsumoto et al. | 455/126 |
| 5,548,246 | * | 8/1996 | Yamamoto et al. | 330/51 |
| 5,603,106 | * | 2/1997 | Toda | 455/126 |
| 5,732,334 | * | 3/1998 | Miyake | 455/126 |
| 5,758,269 | * | 5/1998 | Wu | 455/127 |
| 5,834,975 | * | 11/1998 | Bartlett et al. | 330/278 |
| 5,852,770 | * | 12/1998 | Kasamatsu | 455/126 |
| 5,862,461 | * | 1/1999 | Yoshizawa et al. | 455/127 |
| 5,872,481 | * | 2/1999 | Sevic et al. | 330/51 |
| 5,887,245 | * | 3/1999 | Lindroth et al. | 455/69 |
| 5,923,213 | * | 7/1999 | Darthenay et al. | 330/51 |

FOREIGN PATENT DOCUMENTS 57-60739   4/1982 (JP).

* cited by examiner

Primary Examiner—Nguyen Vo
Assistant Examiner—Charles N. Appiah
(74) Attorney, Agent, or Firm—Young & Thompson

(57) ABSTRACT

In a transmitter mounted on a mobile station for communicating with a base station, a transmission power amplifying section is formed by a plurality of amplifiers, and a plurality of switch circuits are connected to the outputs of the amplifiers, respectively. A control circuit is connected to the amplifiers and the switch circuits, and activates at least one of the amplifiers and operates the switch circuits to serially connect the at least one amplifier in accordance with the distance between the mobile station and the base station.

4 Claims, 12 Drawing Sheets

Fig. 6

| STATE | $C_1$ | $C_2$ | $C_3$ | $C_4$ | $C_5$ | $C_6$ | $C_7$ | $C_8$ |
|---|---|---|---|---|---|---|---|---|
| I | H | H | H | H | H | H | H | H |
| II | H | L | H | H | H | L | L | L |
| III | L | H | H | L | L | H | L | L |
| IV | L | L | L | L | L | L | L | L |

H: HIGH LEVEL "1"
L: LOW LEVEL "0"

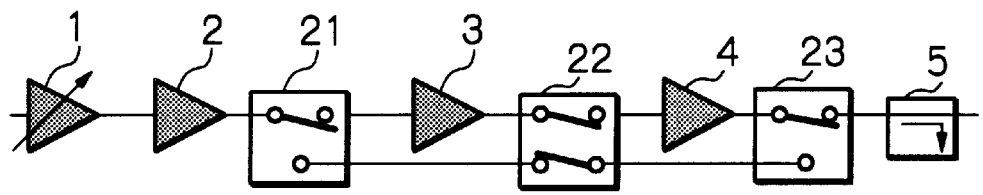
*Fig. 7A* STATE I
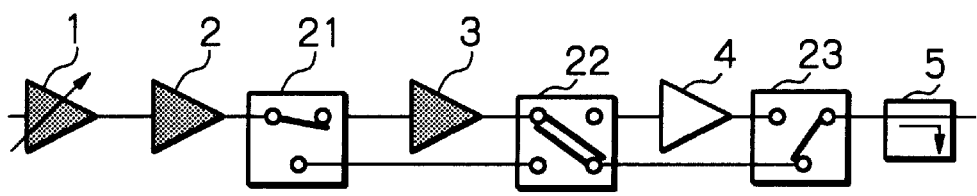
*Fig. 7B* STATE II
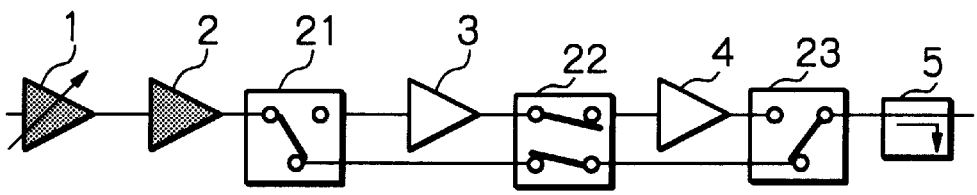
*Fig. 7C* STATE III
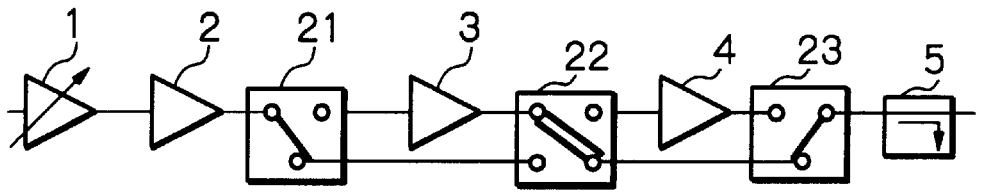
*Fig. 7D* STATE IV

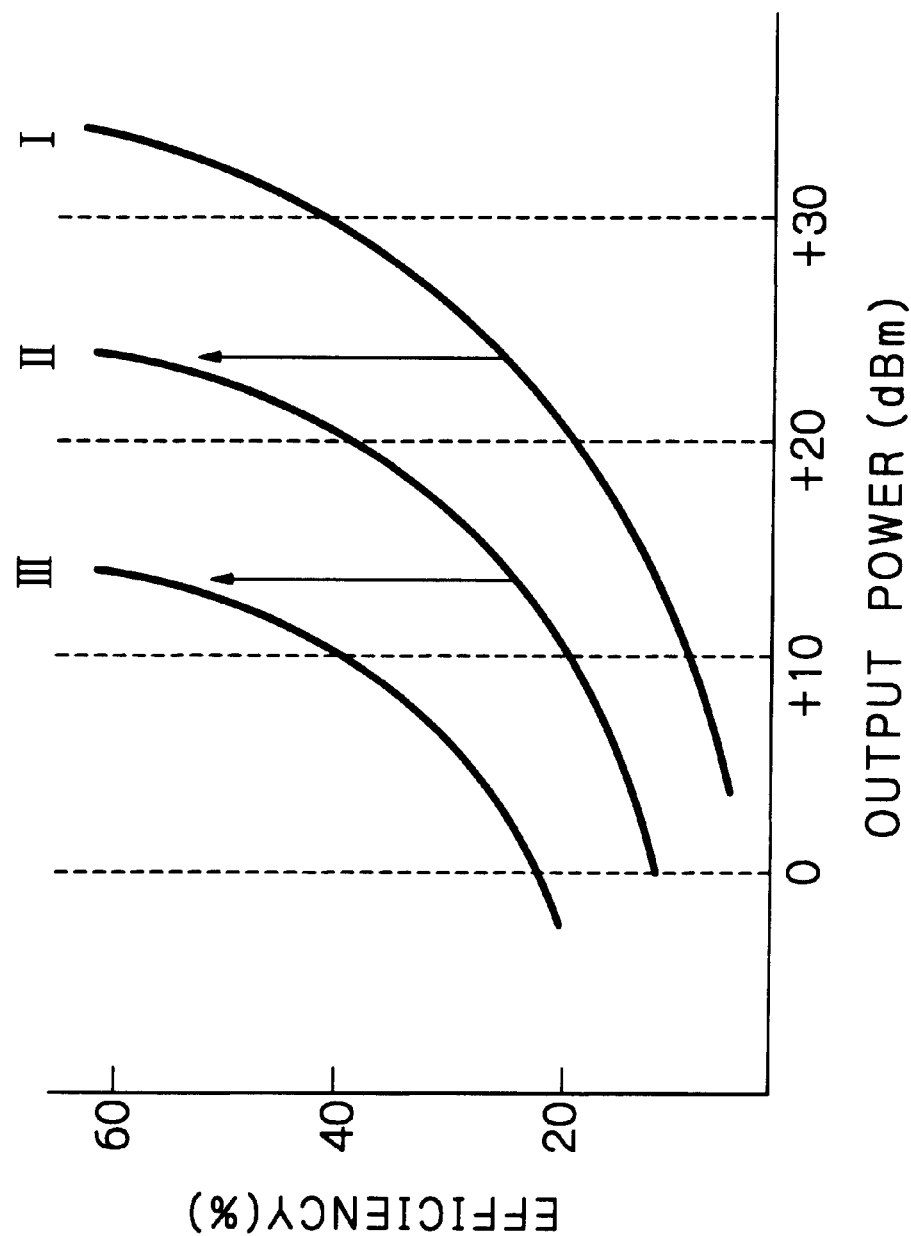

Fig. 10

| STATE | $C_1$ | $C_2$ | $C_3$ | $C_4$ | $C_5$ | $C_6$ | $C_7$ | $C_8$ |
|---|---|---|---|---|---|---|---|---|
| I (PDC) | H | H | H | H | H | H | H | H |
| II (PDC) | L | H | H | L | L | H | L | L |
| III (PHS) | H | L | H | H | H | L | L | L |
| IV | L | L | L | L | L | L | L | L |

H: HIGH LEVEL "1"
L: LOW LEVEL "0"

Fig. 11A  STATE I (PDC)
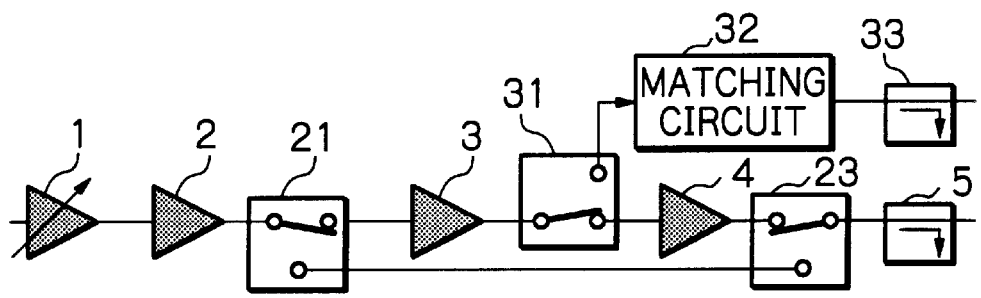
Fig. 11B  STATE II (PDC)
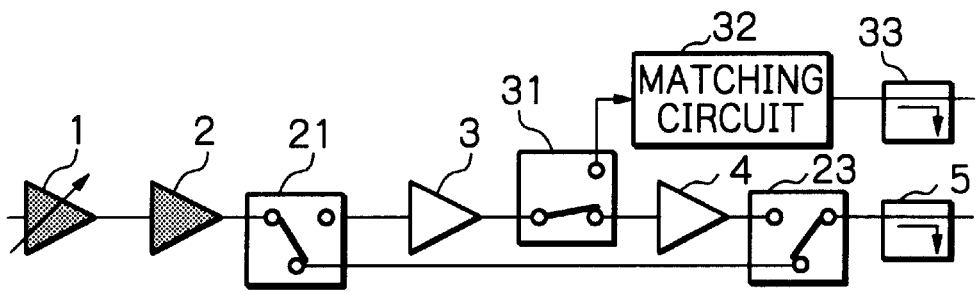
Fig. 11C  STATE III (PHS)
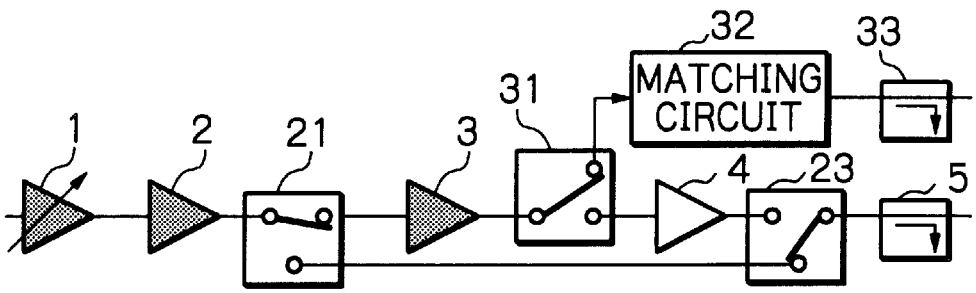
Fig. 11D  STATE IV
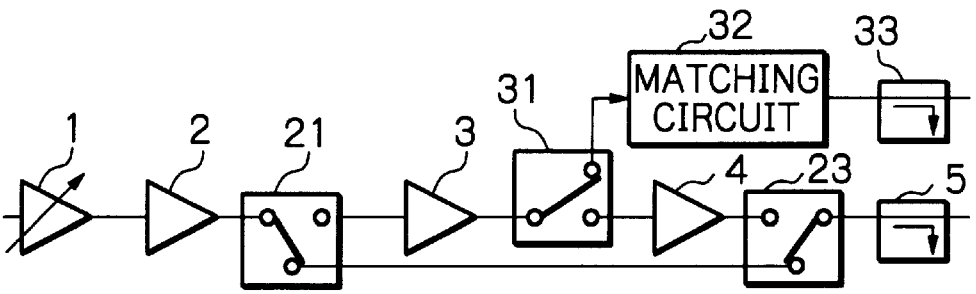

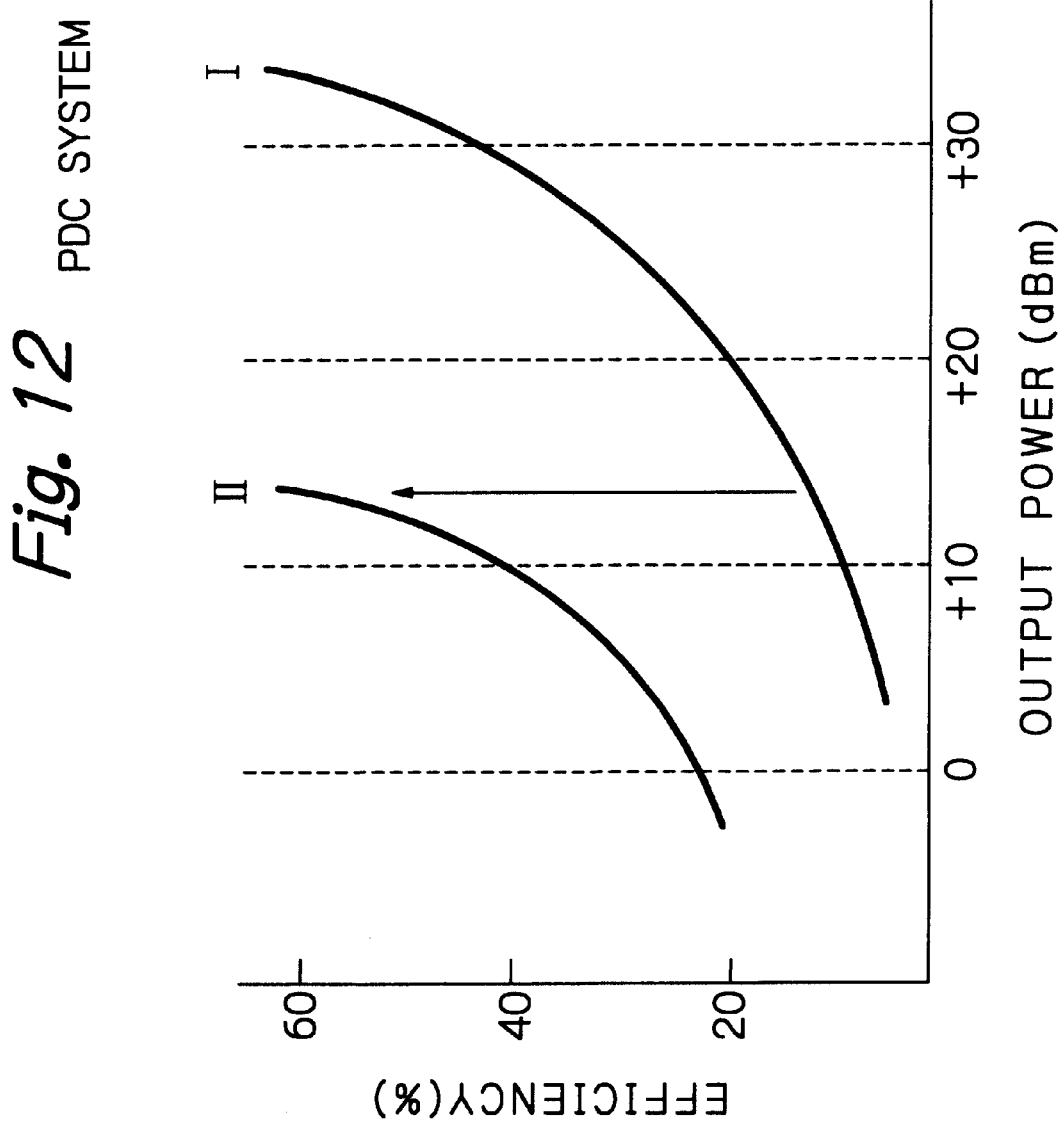
Fig. 12 PDC SYSTEM

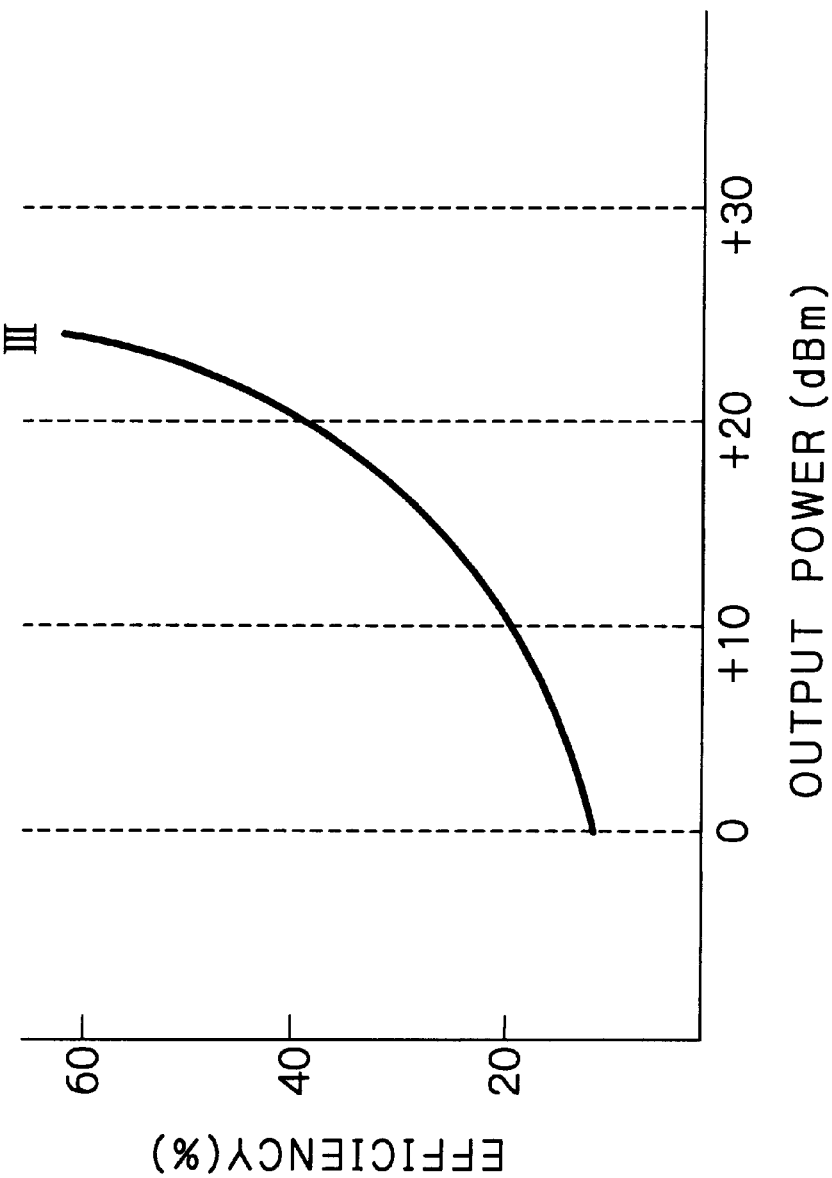
Fig. 13 PHS SYSTEM

MOBILE COMMUNICATION TRANSMITTER CAPABLE OF SELECTIVELY ACTIVATING AMPLIFIERS

BACKGROUND OF THE INVENTION

1. Field of the Invention

The present invention relates to a mobile communication transmitter mounted on a mobile station for communicating with a base station.

2. Description of the Related Art

In a portable telephone set constructed by a transmitter for mobile communication, amplifiers constituting a transmission power amplifying section take most of the power dissipated in the telephone set and hence the performance of the portable telephone set in terms of sustainable duration of call is heavily dependent on the efficiency of signal transmission of the transmission power amplifying section. The efficiency of signal transmission of the transmission power amplifying section of the portable telephone set is expressed by the ratio of high frequency output power/input DC power. The efficiency is determined by the impedance characteristics of the matching circuits of the amplifiers. However, since the impedance characteristics of the matching circuits vary depending on the output power and the transmitter frequency, the impedance of the matching circuits has to be selected according to the transmitter frequency and the output power to be used for the portable telephone set.

In a prior art transmitter for mobile communication, the matching circuits of the amplifiers have a fixed impedance that is selected to realize a maximum efficiency for a maximum power output in the frequency band to be used with the portable telephone set in order to amplify a high frequency wave highly efficiently. This will be explained later in detail.

In the prior art transmitter, however, since the amplifiers are adapted to be matched by means of input/output matching circuits, the transmission power amplifying section of the transmitter is accompanied by the problem of a reduced efficiency at a low output level.

JP-A-57-60739 discloses a transmitter adapted to automatically select an output matching circuit that can minimize the efficiency out of a plurality of prearranged output matching circuits in order to improve the efficiency for low output operation. This transmitter is formed by a controller for issuing a switch signal for selecting an output matching circuit and an optimal value determining unit for selecting an optimal matching circuit and transmitting a signal to a matching switch circuit in addition to the components of the conventional portable telephone system.

However, with the transmitter of JP-A-57-60739, the amplifiers (transistors) of the transmitter are not modified if an optimal output matching circuit is selected as a function of the output power level. In other words, no improvement can be expected for the efficiency of the transmitter in the operating zone of 10 to 30 dB below the maximum output level if it is used for a portable telephone system. This is because, while large transistors having a large gate width in the case of FETs and having a size corresponding to the number of emitters in the case of bipolar transistors have to be used to accommodate the predetermined maximum output power, the transistors show a fall in the efficiency of amplification when they are driven in the operating zone of 10 to 30 dB below the maximum output level if compared with transistors having an optimal size. The reasons for this are as follows:

(1) The large transistors have a low impedance and hence cannot be matched perfectly.

(2) The matching circuit itself that is matched with such a low impedance can show a high passing loss.

(3) Generally, a large transistor is constructed by a plurality of unit cells coupled in parallel and the potential of the cells cannot be exploited fully due to the variances in the performance of the cells and the coupling loss of the cells.

(4) A large transistor shows a low gain when compared with an element having a size optimally adapted to a low output level.

Thus, it will be obvious that the efficiency of operation of the transistors having a size optimally adapted to a low output level is by far higher than the efficiency of operation of the transistors having a larger size particularly in the operating zone around the maximum output level.

The ratio of the maximum transmission output and the minimum transmission output is referred to as output dynamic range, which is about 30 dB for conventional portable telephone sets. However, an output dynamic range of 60 to 70 dB is required for portable telephone sets to be used for a code division multiple access (CDMA) system that has become commercially available recently. Thus, it is particularly necessary for the transmission power amplifying section of a portable telephone set having such a wide dynamic range to show an improved efficiency.

However, with the transmitter of JP-A-57-60739, the transistor arranged in the last stage has a predetermined size and hence shows an efficiency of less than 10% for a low output level of about +10 to −10 dBm as in the case of the above described amplifiers if an optimal output matching circuit is selected out of a plurality of matching circuits as a function of the output level. Thus, the technique disclosed in JP-A-57-60739 is not effective for achieving a wide output range. It should be noted here that JP-A-57-60739 describes only a transmitter with 0.5 W (+27 dBm) for a low output level and 2 W (+33 dBm) for the maximum output level as a specific example.

Additionally, a transmitter as described in JP-A-57-60739 is constructed by PIN diodes as means for selecting an output matching circuit, which has to be constantly biased so that all the output matching circuits may be switched sequentially. Then, an electric current of several mA flows through the biased PIN diodes. Since a pair of PIN diodes are required for each of the output matching circuits, a total of 2×n PIN diodes have to be used for "n" matching circuits. If a PIN diode consumes power at a rate of 1 mA, then the power dissipation of all the PIN diodes will be n×2 mA regardless of the output power of the transmitter. This raises a serious problem for a portable telephone set that is required to be of an power saving type.

SUMMARY OF THE INVENTION

It is an object of the present invention to provide a transmitter for mobile communication that can provide a high efficiency for a wide output dynamic range.

According to the present invention, in a transmitter mounted on a mobile station for communicating with a base station, a transmission power amplifying section is formed by a plurality of amplifiers, and a plurality of switch circuits are connected to the outputs of the amplifiers, respectively. A control circuit is connected to the amplifiers and the switch circuits, and activates at least one of the amplifiers and operates the switch circuits to serially connect the at least one amplifier in accordance with the distance between the mobile station and the base station.

BRIEF DESCRIPTION OF THE DRAWINGS

The present invention will be more clearly understood from the description as set forth below, as compared with the prior art, with reference to the accompanying drawings, wherein:

FIG. 6 is a table showing a relationship between the control signals of the control circuit and the control signals of the voltage control circuit of FIG. 4;

FIGS. 7A through 7D are block circuit diagrams for explaining the operation of the transmitter of FIG. 4;

FIG. 8 is a graph showing a relationship between the transmission output power and the efficiency of the transmission power amplifying section of FIG. 4.

FIG. 10 is a table showing a relationship between the control signals of the control circuit and the control signals of the voltage control circuit of FIG. 9;

FIGS. 11A through 11D are block circuit diagrams for explaining the operation of the transmitter of FIG. 9; and FIGS. 12 and 13 are graphs showing relationships between the transmission output power and the efficiency of the transmission power amplifying section of FIG. 9.

DESCRIPTION OF THE PREFERRED EMBODIMENTS

Before the description of the preferred embodiments, a prior art mobile communication transmitter will be explained with reference to FIGS. 1 and 2.

Figure 1:
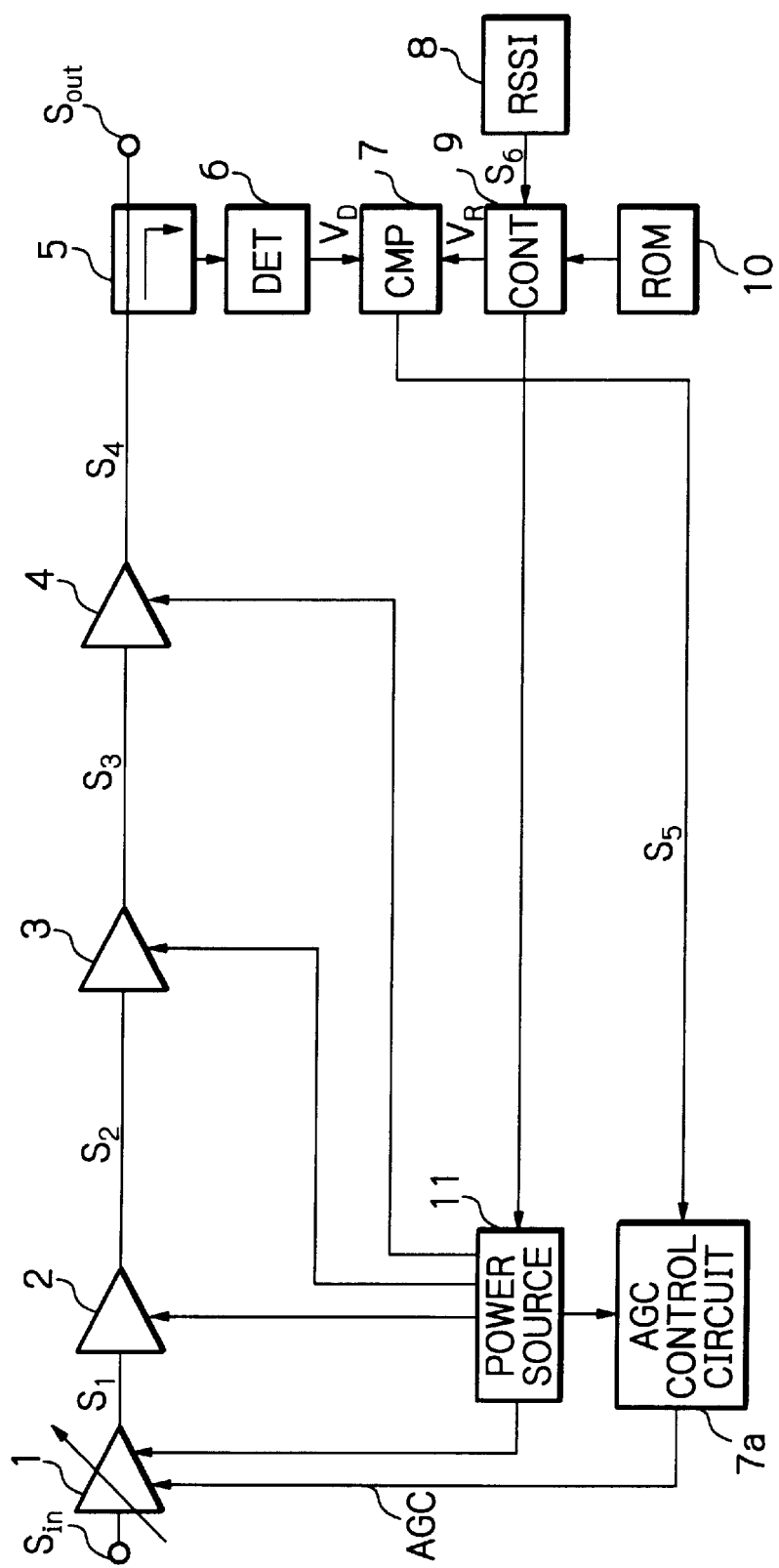
FIG. 1 is a block circuit diagram illustrating a prior art mobile communication transmitter.

In FIG. 1, which illustrates a prior art mobile communication transmitter mounted in a mobile station, an input signal $S_{in}$ is amplified by an automatic gain control (AGC) amplifier 1 and amplifiers 2, 3 and 4, and is output via a directional coupler 5 as an output signal $S_{out}$.

The AGC amplifier 1 amplifies the input signal $S_{in}$ with an AGC gain determined by an AGC control voltage, and generates an output signal $S_1$.

The amplifier 2 amplifies the output signal $S_1$ of the AGC amplifier 1 with a constant gain and generates an output signal $S_2$.

The amplifier 3 amplifies the output signal $S_2$ of the amplifier 2 with a constant gain and generates an output signal $S_3$.

The amplifier 4 amplifies the output signal $S_3$ of the amplifier 3 with a constant gain and generates an output signal $S_4$.

The directional coupler 5 generates about 1/100 of the output signal $S_4$ of the amplifier 4 to a detector 6 and generates the remaining output as the output signal $S_{out}$.

The detector 6 detects the output signal from the directional coupler 5 and outputs it as a detection voltage $V_D$. A comparator 7 compares the detection voltage $V_D$ from the detector 6 with a reference voltage $V_R$ from a control circuit 9, and generates a correction signal $S_5$ and transmits it to an AGC voltage control circuit 7a to compensate for the difference between the detection voltage $V_D$ and the reference voltage $V_R$. The AGC voltage control circuit 7a generates the AGC control voltage in accordance with the correction signal $S_5$.

The mobile station system is typically provided with a functional feature of automatic power control (APC) for controlling the output power of the transmitter by selecting one of several predetermined power levels according to the distance between a base station and the mobile station. Thus, the mobile station detects the signal strength of radio waves transmitted from the base station and received by it by means of a received signal strength indicator (RSSI) 8 in order to obtain a signal $S_6$ on the distance between the base station and the mobile station. The distance signal $S_6$ is then transmitted to the control circuit 9.

The control circuit 9 reads out the reference voltage $V_R$ from a read-only memory (ROM) 10 using the distance signal $S_6$ as an argument.

The control circuit 9 also controls a power supply source 11 for supplying power supply voltage to the AGC amplifier 1, the amplifiers 2, 3 and 4, and the AGC voltage control circuit 7a in accordance with the system requirement. For example, the control circuit 9 periodically turns OFF the power supply source 11, thus reducing the power dissipation.

Figure 2:
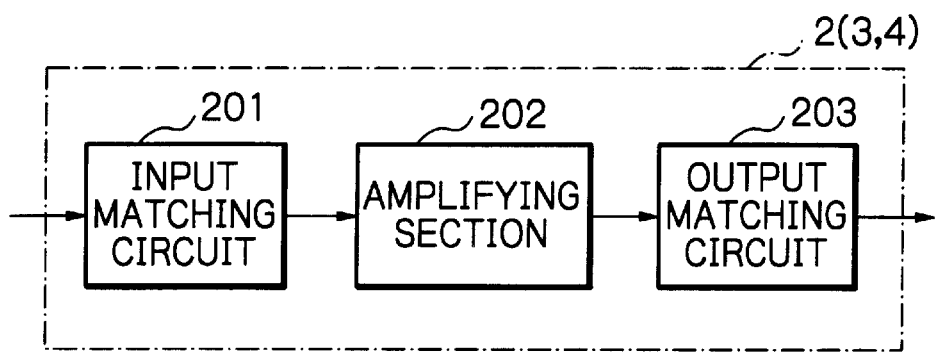
FIG. 2 is a detailed block circuit diagram of the amplifier of FIG. 1.

As illustrated in FIG. 2, the amplifier 2 is formed by an input matching circuit 201 with a fixed impedance, an amplifying section 202 typically constituted by a field effect transistor (FET) and an output matching circuit 203 with a fixed impedance. The amplifier 2 is made to match the characteristic impedance of 50Ω by the input matching circuit 201 and the output matching circuit 203 in order to realize a maximum efficiency within a range selected to satisfy the required distortion characteristics. Note that the amplifiers 3 and 4 have the same configuration as the amplifier 2.

Since the mobile station is required by specifications to realize desired characteristics at a maximum output level, the input matching circuit 201 and the output matching circuits 203 of the amplifiers 2, 3 and 4 are so arranged as to realize a maximum efficiency when the output power of the amplifier 4 reaches its maximum level.

Figure 3:
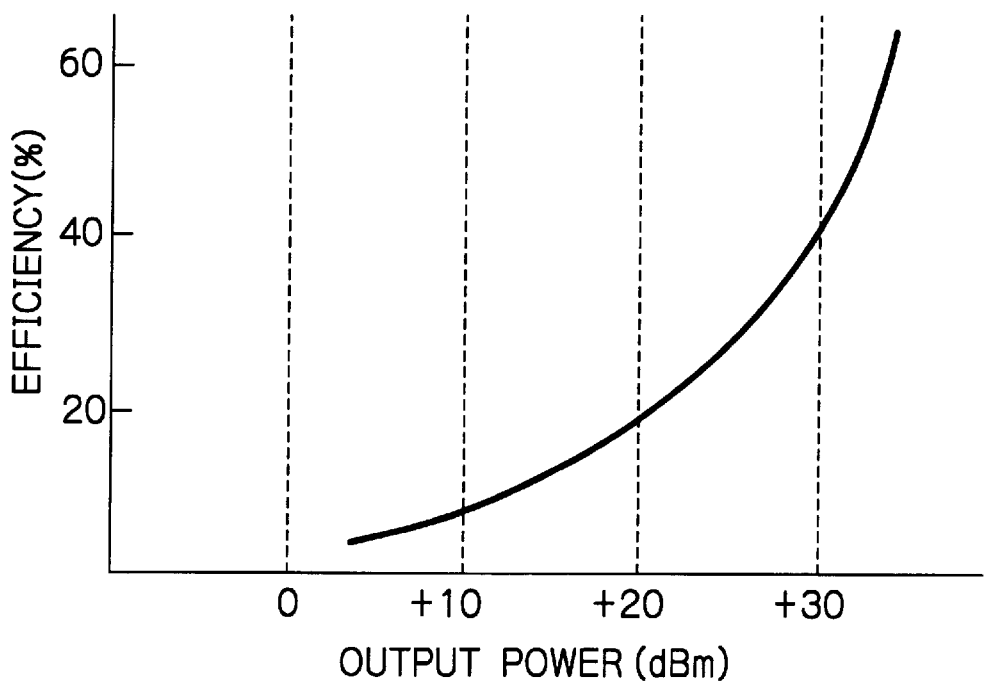
FIG. 3 is a graph showing a relationship between the transmission output power and the efficiency of the transmission power amplifying section of FIG. 1.

However, as the matching circuits 201 and 203 are so arranged as to realize a maximum efficiency for the amplifying sections when the output of the APC reaches its maximum level, the efficiency of the transmission power amplifying section (2, 3, 4) will be reduced when the output power level is lowered, as shown in FIG. 3.

It will be seen from FIG. 3 that the transmission power amplifying section (2, 3, 4) shows an efficiency of 60% or more with an output level of 1 W (+30 dBm) or higher, but the efficiency falls below 10% when the output level is reduced by 20 dB (to +10 dBm).

Generally, a difference between the maximum output level and the minimum output level of the APC is about 20 to 30 dB, and the APC is operating with the minimum output level in urban areas and in areas where the mobile station is located close to the base station. However, since the mobile station shows a low efficiency for the transmission power amplifying section (2, 3, 4) when the output power level is low, it cannot effectively reduce the power dissipation if it is used in such areas.

There has been proposed a technique of reducing idle currents of the amplifiers that flow when no high frequency signal is received by modifying the predetermined level of the gate bias voltage according to the output level of the APC in order to improve the efficiency of the mobile station. However, since the gate bias voltage can be modified only by 0.3 V from the level predetermined for the maximum power output by such a technique, while the technique may be effective for reducing the fall of efficiency in the operating zone 5 to 10 dB below the maximum output level, it is practically useless in the zone of 20 to 30 dB below the maximum output level and the efficiency falls to less than 10% as in the case where such a technique is not used.

Figure 4:
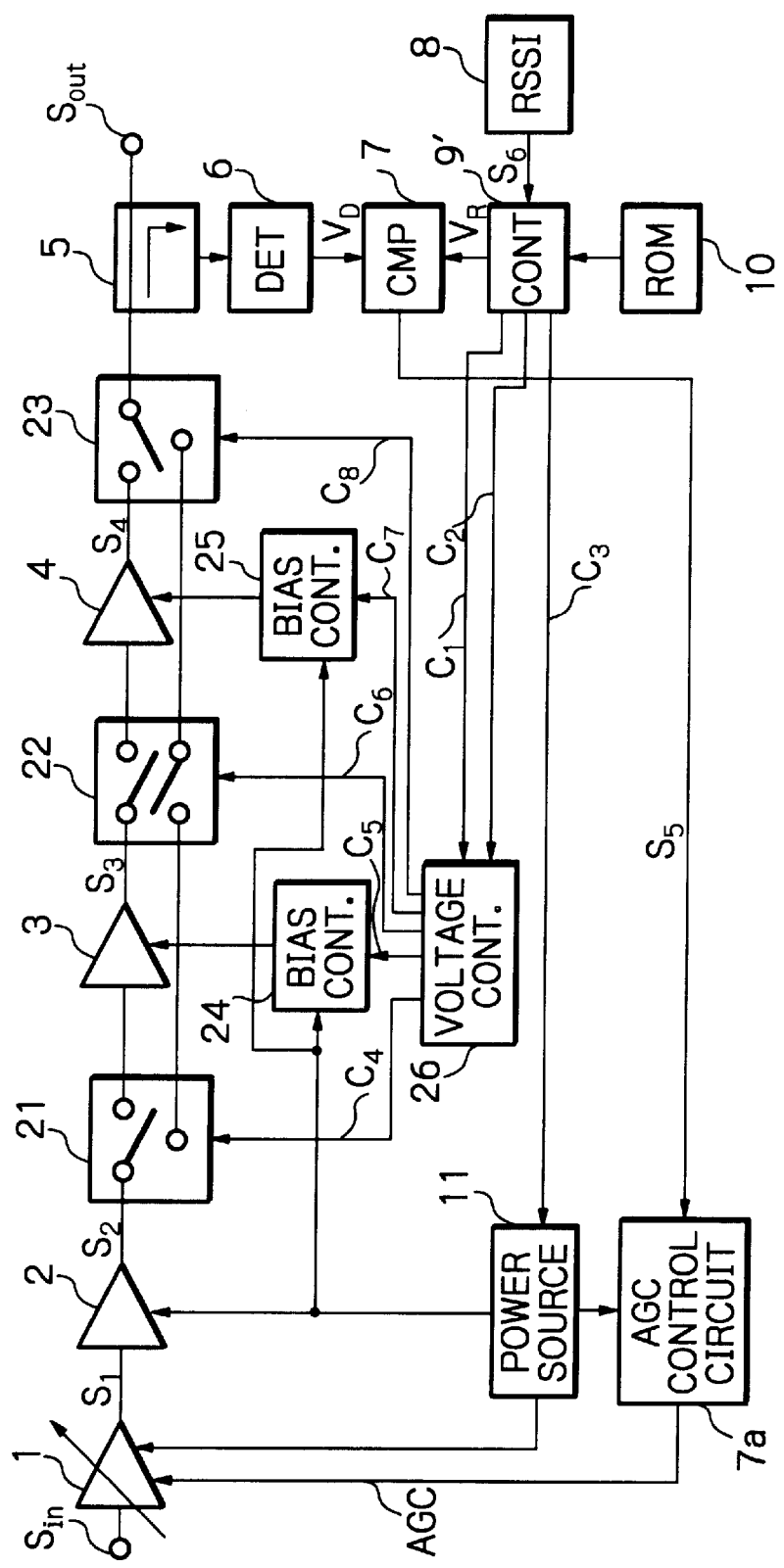
FIG. 4 is a block circuit diagram illustrating a first embodiment of the mobile communication system according to the present invention.

In FIG. 4, which illustrates a first embodiment of the present invention, a switch circuit 21 is provided between the amplifiers 2 and 3 of FIG. 1, a switch circuit 22 is provided between the amplifiers 2 and 3 of FIG. 1, and a switch circuit 23 is provided between the amplifier 4 and the directional coupler 5 of FIG. 1. The switch circuits 21, 22 and 23 are connected in series. Also, a bias control circuit 24 is provided between the power supply source 11 and the amplifier 3 of FIG. 1, and a bias control circuit 25 is provided between the power supply source 11 and the amplifier 4 of FIG. 1. A voltage control circuit 26 controls the switch circuits 21, 22 and 23 and the bias control circuits 24 and 25.

Figure 5:
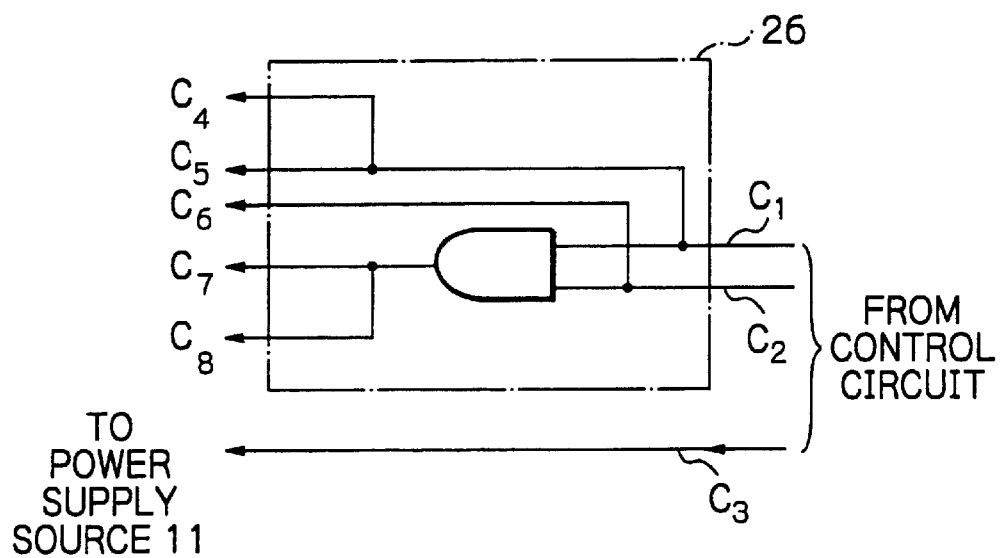
FIG. 5 is a detailed circuit diagram of the voltage control circuit of FIG. 4.

A control circuit 9' is provided instead of the control circuit 9 of FIG. 1. The control circuit 9' controls the voltage control circuit 26 in addition to the comparator 7 and the power supply source 11. That is, the control circuit 9' reads out the reference voltage $V_R$ from the ROM 10 using the distance signal $S_6$ as an argument. Also, the control circuit 9' reads out control signals $C_1$, $C_2$ and $C_3$ from the ROM 10 using the distance signal $S_6$ as an argument. The voltage control circuit 26 receives the control signals $C_1$ and $C_2$ from the control circuit 9' to generate control signals $C_4$, $C_5$, $C_6$, $C_7$ and $C_8$. The voltage control circuit 26 is illustrated in FIG. 5. Therefore, if the control circuit 9' generates the control signals $C_1$, $C_2$ and $C_3$ as shown in FIG. 6, the voltage control circuit 26 generates the control signals $C_4$, $C_5$, $C_6$, $C_7$ and $C_8$ as shown in FIG. 6. Note that the control signal $C_3$ is an OR logic between the control signals $C_1$ and $C_2$.

Each of the switch circuits 21 and 23 is formed by a single pole dual throw (SPDT) switch circuit. For example, if the control signal $C_4$ is high (="1"), the switch circuit 21 connects the amplifier 2 to the amplifier 3, while if the control signal $C_4$ is low (="0"), the switch circuit 21 connects the amplifier 2 to the switch circuit 22. Also, if the control signal $C_8$ is high (="1"), the switch circuit 23 connects the amplifier 4 to the directional coupler 15, while if the control signal $C_8$ is low (="0"), the switch circuit 23 connects the switch circuit 22 to the directional coupler 5.

The switch circuit 22 is formed by a double pole dual throw (DPDT) switch circuit. For example, if the control signal $C_6$ is high (="1"), the switch circuit 22 connects the amplifier 3 and the switch circuit 21 to the amplifier 4 and the switch circuit 23, respectively. On the other hand, if the control signal $C_6$ is low (="0"), the switch circuit 22 connects the amplifier 3 to the switch circuit 23.

The switch circuits 21, 22 and 23 are preferably terminating type switches in order to minimize the return loss that arises when turned OFF.

The amplifiers 2, 3, and 4 have different element sizes and are arranged in the ascending order of their output power levels or in the order of the amplifier 2, the amplifier 3 and the amplifier 4 in order to realize a high efficiency.

The switch circuits 21, 22 and 23 and the amplifiers 2, 3 and 4 are controlled for switching states I, II and III as shown in FIG. 6 in such a way that the output power level to be selected for each element is predetermined in order to realize a high efficiency over a wide dynamic range and the data relating to the switching operation of each element are stored in the ROM 11. The APC operation that does not need to change the number of the amplifiers 2, 3 and 4 is conducted by modifying the gain of the AGC amplifier 1 by means of the AGC voltage control circuit 7a as in the transmitter of FIG. 1. The switching control of the states I, II and III has priority over the APC so that an APC operation can take place only after the switching control.

The states I, II and III of FIG. 6 are dependent upon the distance between the mobile station and the base station, i.e., the distance signal $S_6$.

Now, the operation of the transmitter of FIG. 4 will be explained with reference to FIGS. 7A, 7B, 7C, 7D and 8.

A signal to be transmitted is firstly modulated by a base band section (not shown) and then made to show the transmission frequency before it is entered into the AGC amplifier 1.

If the mobile station is separated from the base station by a long distance, the control information read out of the ROM 10 in correspondence to the distance signal $S_6$ serves to adapt the transmission power amplifying section to the maximum output level. Thus, the control circuit 9' generates a reference voltage $V_R$ to the comparator 7 that makes the transmission power amplifying section adapt to the maximum output level. Additionally, the control circuit 9' causes the control signals $C_1$, $C_2$ and $C_3$ to be high (see state I of FIG. 6) in order to adapt the transmission power amplifying section to the maximum output level. As a result, all the control signals $C_4$, $C_5$, $C_6$, $C_7$ and $C_8$ generated by the voltage control circuit 26 are high (="1") as shown in FIG. 6.

In the state I, the power supply source 11 is turned ON by the control signal $C_3$ so that consequently the AGC voltage control circuit 7a, the AGC amplifier 1, the amplifier 2, and the bias control circuits 24 and 25 are fed with a power supply voltage. The bias control circuit 24 forwards the voltage from the power supply source 11 to the amplifier 3, while the bias control circuit 25 forwards the voltage from the power supply source 11 to the amplifier 4. Thus, as shown in FIG. 7A, the amplifiers 2, 3 and 4 are activated.

Furthermore, in the state I, the switch circuit 21 forwards the output of the amplifier 2 to the amplifier 3, and the switch circuit 22 forwards the output of the amplifier 3 to the amplifier 4, and the switch circuit 23 forwards the output of the amplifier 4 to the directional coupler 5. Thus, as shown in FIG. 7A, the transmission signal entered into the AGC amplifier 1 is output by way of the route of the amplifier 2→the switch circuit 21→the amplifier 3→the switch circuit 22→the amplifier 4→the switch circuit 23→the directional coupler 5.

The directional coupler 5 transmits a signal with a level of a hundredth of the transmission output level to the detector 6. The output of the directional coupler 5 is transformed into a detection voltage $V_D$ that is a DC voltage detected by the detector 6 and then sent to the comparator 7. The comparator 7 compares the detection voltage $V_D$ with the reference voltage $V_R$ from the control circuit 9' so that a correction signal $S_5$ is transmitted to the AGC voltage control circuit 7a in order to minimize the difference between the detection voltage $V_D$ and the reference voltage $V_R$. The AGC voltage control circuit 7a regulates the gain of the AGC amplifier 1 by modifying the AGC voltage to shift the output power level to the amplifier 2 to the level specified by the correction signal $S_5$. In this way, the control circuit 9' sets the output power level of the output terminal of the switch circuit 23 to a desired value.

Curve I in FIG. 8 shows the relationship between the output power of the transmission power amplifying section and the efficiency of its operation in state I as shown in FIG. 7A. Note that, if the maximum output level of the mobile station is +31 dBm, the efficiency of the transmission power amplifying section will be about 60%.

Now, assume that the mobile station moves close to the base station. Then, the AGC amplifier 1 is regulated to reduce its gain and hence the output level of the transmission power amplifying section is lowered in response to the change in the distance signal $S_6$. As a result, the efficiency of the transmission power amplifying section is reduced from the maximum output level. For example, if the efficiency of the output power of +31 dBm is 60%, it will be lowered to somewhere around 20% when the output power is reduced to +20 dBm.

In the above-described state, the control circuit 9' detects that the mobile station is moving closer to the base station on the basis of the distance signal $S_6$ and causes the control signal $C_2$ to be low (="0") (see state II of FIG. 6). Therefore, the voltage control circuit 26 causes the control signals $C_6$, $C_7$ and $C_8$ to be low (="0"). As a result, as shown in FIG. 7B, the amplifier 3 is connected via the switch circuits 22 and 23 to the directional coupler 5. Simultaneously, the bias control circuit 25 interrupts the supply of voltage to the amplifier 4, so that the amplifier 4 is deactivated, thus reducing the power dissipation. Consequently, as shown in FIG. 7B, the transmission signal entered into the AGC amplifier 1 is output by way of the route of the amplifier 2→the switch circuit 21→the amplifier 3→the switch circuit 22→the switch circuit 23→the directional coupler 5. In other words, the amplifiers 2 and 3 are turned ON while the amplifier 4 is turned OFF.

Curve II in FIG. 8 shows the relationship between the output power of the transmission power amplifying section and the efficiency of its operation under state II as shown in FIG. 6. It will be seen from FIG. 8 that the transmission power amplifying section shows an efficiency of about 60% when the output power is about +23 dBm to +24 dBm.

As the mobile station moves on to approach closer to the base station, the gain of the AGC amplifier 1 is regulated to reduce the output power of the transmission power amplifying section to lower the efficiency of operation of the transmission power amplifying section. For example, the efficiency will become as low as 20% when the output power at the output terminal of the switch circuit 23 is reduced to about +12 dBm.

However, upon detecting that the mobile station is very close to the base station on the basis of the distance signal $S_6$, the control circuit 9' causes the control signals $C_1$ and $C_2$ to be low (="0") and high (="1"), respectively (see state III of FIG. 6). Therefore, the voltage control circuit 26 causes the control signals $C_4$ and $C_5$ to be low (="0") and causes the control signal $C_6$ to be high (="1"). As a result, as shown in FIG. 7C, the amplifier 2 is connected via the switch circuits 21, 22 and 23 to the directional coupler 5. Simultaneously, the bias circuit 24 interrupts the supply of voltage to the amplifier 3, so that the amplifier 3 is deactivated, thus reducing the power dissipation. Consequently, the transmission signal entered into the AGC amplifier 1 is output by way of the route of the amplifier 2→the switch circuit 21→the switch circuit 22→the switch circuit 23→the directional coupler 5. In other words, only the amplifier 2 is turned ON while the amplifiers 3 and 4 are turned OFF so that the output of the amplifier 2 is directly used as output power of the transmission power amplifying section of the mobile station.

Curve III in FIG. 8 shows the relationship between the output power of the transmission power amplifying section and the efficiency of its operation under state III as shown in FIG. 6. It will be seen from FIG. 8 that the transmission power amplifying section shows an efficiency slightly lower than 60% when the output power is reduced to about +12 dBm to 13 dBm.

On the other hand, under a special state IV as shown in FIG. 6, the control circuit 9' causes all the control signals $C_1$, $C_2$ and $C_3$ to be low (="0"). As a result, the AGC voltage control circuit 7a, and the AGC circuit 1 are deactivated. Simultaneously, as shown in FIG. 7D, all the amplifiers 2, 3 and 4 are deactivated.

In the first embodiment, the transmission power amplifying section operates with an efficiency of about 60% over a wide output power range between +12 dBm and +31 dBm. Thus, the efficiency of the transmission power amplifying section can be held to a high level over a wide output dynamic range.

Note that a general sequential control technique may be used for the first embodiment if the elements employed in the amplifiers 2 through 4 require special consideration in the manner of biasing or, for example, a gate bias voltage and a drain bias voltage have to be sequentially applied in the above order for biasing the FETs of the amplifiers.

The first embodiment can be used for a portable telephone system or the like without modifying any other elements of the system.

With the first embodiment, the variable range of the gain of the AGC amplifier 1 can be reduced by more than 20 dB because the transmission power is regulated by selectively using the amplifiers 2, 3 and 4.

Additionally, while the amplifiers 2, 3 and 4 are matched to provide a maximum efficiency for the maximum output level in the first embodiment, it is a known practice in the design of amplifiers to arrange matching circuits so as to achieve a maximum efficiency under the conditions that satisfy desired distortion characteristics if they are used in a system that requires the adjacent channel leakage power to be suppressed below a specified level.

Particularly, in the case of code division multiple access (CDMA) type portable telephone systems that have been increasingly attracting attention in recent years, data shows that the transmission power level of 0 to +10 dBm is used by far much more frequently than any other power levels. Additionally, portable telephone sets available today are required to maximize the efficiency at the highest output level and, at the same time, show an improved efficiency at the output level of 0+10 dBm. Since the first embodiment can meet these requirements satisfactorily, it is particularly adapted to a CDMA type portable telephone system.

Figure 9:
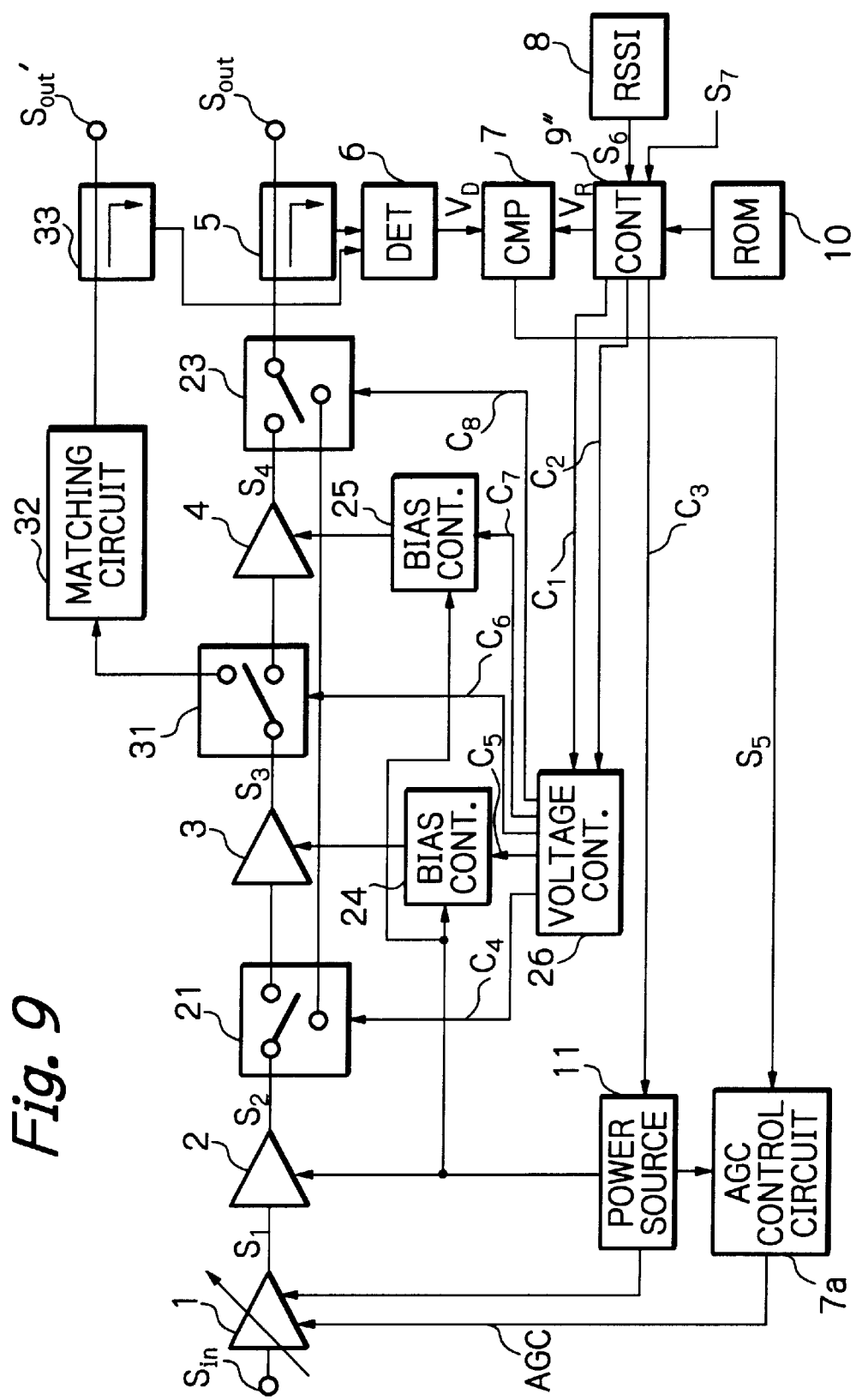
FIG. 9 is a block circuit diagram illustrating a second embodiment of the mobile communication transmitter according to the present invention.

In FIG. 9, which illustrates a second embodiment of the present invention, a dual band system is adopted. That is, an SPDT type switch circuit 31 formed by an SPDT switch circuit is provided instead of the DPDT type switch circuit 22 of FIG. 4, and a matching circuit 32 and a directional coupler 33 for generating an output signal $S_{out}'$ are connected to the switch circuit 31. For example, if the control signal $C_6$ is high (="1"), the switch circuit 31 connects the amplifier 3 to the amplifier 4, while if the control signal $C_6$ is low (="0"), the switch circuit 31 connects the amplifier 3 to the matching circuit 32.

The matching circuit 32 makes the output of the switch circuit 31 match the selected impedance and forwards this output to the directional coupler 33. A desired frequency band can be selected for the maximum efficiency.

The directional coupler 33 has the same configuration as the directional coupler 5 and is arranged at the output side of the matching circuit 32 so that a transmission output with a power level that is about a hundredth of the power level of the output generated by way of the matching circuit 32 is fed to the detector 6.

Assume now that the second embodiment is applied to the transmission power amplifying section of a mobile station adapted to both a personal digital cellular (PDC) system which is a digital portable telephone system available in Japan and a personal handy-phone (PHS) system which is a digital codeless system also available in Japan. The transmission frequency of the mobile station will be f=925 MHz to 960 MHz if a 900 MHz band is used for the PDC system and f=1,429 MHz to 1,453 MHz band if a 1.5 GHz band is used for the PDC system. On the other hand, the transmission frequency of the mobile station will be f=1,895 MHz to 1,918 MHz for the PHS system. Thus, the amplifiers of the mobile station are required to match these different frequencies optimally. Note that the maximum output level is about +30.5 dBm for the PDC system and about +21 dBm for the PHS system.

In view of the foregoing, the amplifiers 2 and 3 will be designed as wide band amplifiers having an operating frequency between 900 MHz and 1.9 GHz and the respective input matching circuit of the amplifiers 2 and 3 (see FIG. 2) will be designed to operate in a desired manner between 925 MHz and 1,920 MHz. Note that the amplifiers 2, 3 and 4 of the second embodiment have the same configuration as those of FIG. 4. Also, note that the amplifier 4 is adapted to be matched so as to provide a maximum efficiency at the maximum output level in a narrow band of 925 MHz to 960 MHz or 1,429 MHz to 1,453 MHz. A maximum efficiency as used herein refers to the efficiency within a range that meets a desired adjacent channel leakage power.

On the other hand, the matching circuit 32 is adapted to match the operating frequency of the PHS system between 1,895 MHz and 1,918 MHz. The switch circuits 21 and 31 show a small insertion loss for a band of about f=900 MHz and that of about 2 GHz. It may be sufficient for the switch circuit 31 to have an operating frequency band similar to the amplifier 4.

Also, a control circuit 9" is provided instead of the control circuit 9' of FIG. 4, to respond to the dual band system. That is, the control circuit 9" also receives a system mode signal $S_7$ in addition to the distance signal $S_6$. Note that the system mode signal $S_7$ for the PDC system or the PHS system is set in advance by the user.

The switch circuits 21, 31 and 23 and the amplifiers 2, 3 and 4 are controlled for switching states I, II and III as shown in FIG. 10 in such a way that the output power level to be selected for each element is predetermined in order to realize a high efficiency over a wide dynamic range and the data relating to the switching operation of each element are stored in the ROM 11. The APC operation that does not need to change the number of the amplifiers 2, 3 and 4 is conducted by modifying the gain of the AGC amplifier 1 by means of the AGC voltage control circuit 7a as in the transmitter of FIG. 1. The switching control of the states I, II and III has priority over the APC so that the APC operation can take place only after the switching control.

When the mobile station is used for the PDC system, the states I and II of FIG. 10 are dependent upon the distance between the mobile station and the base station, i.e., the distance signal $S_6$.

Now, the operation of the transmitter of FIG. 9 will be explained with reference to FIGS. 11A, 11B, 11C, 11D, 12 and 13.

First, assume that the mobile station is used for the PDC system, i.e., the system mode signal $S_7$ indicates the PDC system.

In this case, a signal to be transmitted is firstly modulated by a base band section (not shown) and then made to show the transmission frequency before it is entered into the AGC amplifier 1.

If the mobile station is separated from the base station by a long distance, the control information read out of the ROM 10 in correspondence to the distance signal $S_6$ serves to adapt the transmission power amplifying section to the maximum output level. Thus, the control circuit 9" generates a reference voltage $V_R$ to the comparator 7 that makes the transmission power amplifying section adapt to the maximum output level. Additionally, the control circuit 9" causes the control signals $C_1$, $C_2$ and $C_3$ to be high (see state I of FIG. 10) in order to adapt the transmission power amplifying section to the maximum output level. As a result, all the control signals $C_4$, $C_5$, $C_6$, $C_7$ and $C_8$ generated by the voltage control circuit 26 are high (="1") as shown in FIG. 10.

In the state I, the power supply source 11 is turned ON by the control signal $C_3$ so that consequently the AGC voltage control circuit 7a, the AGC amplifier 1, the amplifier 2, and the bias control circuits 24 and 25 are fed with a power supply voltage. The bias control circuit 24 forwards the voltage from the power supply source 11 to the amplifier 3, while the bias control circuit 25 forwards the voltage from the power supply source 11 to the amplifier 4. Thus, as shown in FIG. 11A, the amplifiers 2, 3 and 4 are activated.

Furthermore, in the state I, the switch circuit 21 forwards the output of the amplifier 2 to the amplifier 3, and the switch circuit 31 forwards the output of the amplifier 3 to the amplifier 4, and the switch circuit 23 forwards the output of the amplifier 4 to the directional coupler 5. Thus, as shown in FIG. 11A, the transmission signal entered into the AGC amplifier 1 is output by way of the route of the amplifier 2→the switch circuit 21→the amplifier 3→the switch circuit 31→the amplifier 4→the switch circuit 23→the directional coupler 5.

The directional coupler 5 transmits a signal with a level of a hundredth of the transmission output level to the detector 6. The output of the directional coupler 5 is transformed into a detection voltage $V_D$ that is a DC voltage detected by the detector 6 and then sent to the comparator 7. The comparator 7 compares the detection voltage $V_D$ with the reference voltage $V_R$ from the control circuit 9' so that a correction signal $S_5$ is transmitted to the AGC voltage control circuit 7a in order to minimize the difference between the detection voltage $V_D$ and the reference voltage $V_R$. The AGC voltage control circuit 7a regulates the gain of the AGC amplifier 1 by modifying the AGC voltage to shift the output power level to the amplifier 2 to the level specified by the correction signal $S_5$. In this way, the control circuit 9" sets the output power level of the output terminal of the switch circuit 23 to a desired value.

Curve I in FIG. 12 shows the relationship between the output power of the transmission power amplifying section and the efficiency of its operation in state I as shown in FIG.

11A. Note that, if the maximum output level of the mobile station is +31 dBm, the efficiency of the transmission power amplifying section will be about 60%.

As the mobile station moves on to approach closer to the base station, the gain of the AGC amplifier 1 is regulated to reduce the output power of the transmission power amplifying section to lower the efficiency of operation of the transmission power amplifying section. For example, the efficiency will become as low as 20% when the output power at the output terminal of the switch circuit 23 is reduced to about +12 dBm.

However, upon detecting that the mobile station is very close to the base station on the basis of the distance signal $S_6$, the control circuit 9" causes the control signals $C_1$ and $C_2$ to be low (="0") and high (="1"), respectively (see state II of FIG. 10). Therefore, the voltage control circuit 26 causes the control signals $C_4$, $C_5$, $C_7$ and $C_8$ to be low (="0"). As a result, as shown in FIG. 11B, the amplifier 2 is connected via the switch circuits 21, 31 and 23 to the directional coupler 5. Simultaneously, the bias circuits 24 and 25 interrupts the supply of voltage to the amplifiers 3 and 4, so that the amplifiers 3 and 4 are deactivated, thus reducing the power dissipation. Consequently, the transmission signal entered into the AGC amplifier 1 is output by way of the route of the amplifier 2 →the switch circuit 23→the directional coupler 5. In other words, only the amplifier 2 is turned ON while the amplifiers 3 and 4 are turned OFF so that the output of the amplifier 2 is directly used as output power of the transmission power amplifying section of the mobile station.

Curve II in FIG. 13 shows the relationship between the output power of the transmission power amplifying section and the efficiency of its operation under state II as shown in FIG. 10. It will be seen from FIG. 13 that the transmission power amplifying section shows an efficiency slightly lower than 60% when the output power is reduced to about +12 dBm to 13 dBm.

Now, assume that the mobile station is used for the PHS system. In this case, the AGC amplifier 1 is regulated to adjust its gain and hence the output level of the transmission power amplifying section is adjusted in response to the change in the distance signal $S_6$.

In this state, the control circuit 9" detects that the mobile station is used for the PHS system by the system mode signal $S_7$ and causes the control signal $C_2$ to be low (="0") (see state III of FIG. 10). Therefore, the voltage control circuit 26 causes the control signals $C_4$ and $C_5$ to be high (="1") and causes the control signals $C_6$, $C_7$ and $C_8$ to be low (="0"). As a result, as shown in FIG. 11C, the amplifier 3 is connected via the switch circuit 31 to the matching circuit 32 and the directional coupler 33. Simultaneously, the bias control circuit 25 interrupts the supply of voltage to the amplifier 4, so that the amplifier 4 is deactivated, thus reducing the power dissipation. Consequently, as shown in FIG. 11C, the transmission signal entered into the AGC amplifier 1 is output by way of the route of the amplifier 2→the switch circuit 21→the amplifier 3→the switch circuit 31→the matching circuit 32→the directional coupler 33. In other words, the amplifiers 2 and 3 are turned ON while the amplifier 4 is turned OFF.

Curve III in FIG. 13 shows the relationship between the output power of the transmission power amplifying section and the efficiency of its operation under state III as shown in FIG. 10.

In the PHS system mode, the amplifier 3 is made to optimally match the PHS system in the narrow band of 1,895 MHz to 1,918 MHz by the matching circuit 32 and its output is sent to the directional coupler 33. The directional coupler 33 transmits a signal with a level of a hundredth of the transmission output level to the detector 6 and then sends the remaining transmission power as the output signal $S_{out}'$. Thus, the second embodiment operates as a PHS terminal.

On the other hand, under a special state IV as shown in FIG. 10, the control circuit 9" causes all the control signals $C_1$, $C_2$ and $C_3$ to be low (="0"). As a result, the AGC control circuit 7a, and the AGC circuit 1 are deactivated. Simultaneously, as shown in FIG. 11D, all the amplifiers 2, 3 and 4 are deactivated.

Thus, the second embodiment operates as a mobile station set having a single transmission power amplifying section that is adapted to two different frequencies of the PDC system and the PHS system, and hence provides a great advantage in terms of component mounting area and manufacturing cost over any prior art mobile stations having two transmission power amplifying sections, one for the PDC system and the other for the PHS system. In a PDC mode, the second embodiment shows an improved efficiency for low output operation as in the case of the first embodiment.

While the second embodiment is adapted to a dual band system of the PDC system and the PHS system, it may be modified to adapt itself to a dual band system of a global system for a mobile (GSM) system using a 900 MHz band and a personal communication network (PCN) system available in Europe or a dual band system of the GSM system and the PHS system.

While the above-described first and second embodiments have a three-stage configuration of amplifiers for the transmission power amplifying section, the present invention can be applied to a transmission power amplifying section having more than three or a two-stage configuration of amplifiers.

As explained hereinabove, according to the present invention, since the transmission power amplifying section can show a high efficiency for low output operation, maintaining a maximum efficiency for the maximum transmission output power level, it can operate highly efficiently over a wide output dynamic range to significantly prolong the sustainable duration of a call. In addition, a single transmission power amplifying section can adapt itself to the transmission of a radio wave in either of two different frequency bands to reduce the element mounting area and the manufacturing cost of the transmission power amplifying section.

I claim:

1. A transmitter mounted on a mobile station for communicating with a base station, comprising:

an automatic gain control amplifier;

first and second directional couplers;

a plurality of amplifier stages connected in series between said automatic gain control amplifier and said first directional coupler, each of said amplifier stages being constructed by one amplifier and one switch circuit;

a matching circuit connected between an intermediate stage of said amplifier stages and said second directional coupler, for realizing a matching at a frequency band different from a frequency band at which said amplifiers are matched; and a control circuit, connected to said amplifier stages, for selectively activating said amplifier of at least one of said amplifier stages and operating the switch circuit of each of said amplifier stages to electrically connect said activated amplifier in series between said automatic gain control amplifier and one of said first and second directional couplers in accordance with a distance between said mobile station and said base station and a system mode signal for selecting one of said first and second directional couplers.

2. The transmitter as set forth in claim 1, wherein said control circuit comprises:

a first control circuit for generating a command signal in accordance with said distance and said system mode signal; and a second control circuit, connected to said first control circuit, for receiving said command signal and selectively activating and connecting said amplifier in series between said automatic gain control amplifier and one of said directional couplers.

3. The transmitter as set forth in claim 1, wherein said switch circuit of each of said amplifier stages is of a single pole double throw type.

4. The transmitter as set forth in claim 1, further comprising:

a detector connected to said first and second directional couplers;

a comparator, connected to said detector and said control circuit, for comparing a detection voltage of said detector with a reference voltage supplied from said control circuit, said reference voltage depending on said distance; and an automatic gain control voltage control circuit, connected to said comparator, for controlling said automatic gain control amplifier so that said detection voltage is brought close to said reference voltage.

* * * * *